US009887071B2

(12) United States Patent
Chen et al.

(10) Patent No.: US 9,887,071 B2
(45) Date of Patent: Feb. 6, 2018

(54) MULTI-ZONE EPD DETECTORS (75) Inventors: Chien-An Chen, Hsinchu (TW);
Yen-Shuo Su, Hsinchu County (TW);
Ying Xiao, Zhubei (TW); Chin-Hsiang Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 672 days.

(21) Appl. No.: 13/328,172

(22) Filed: Dec. 16, 2011

(65) Prior Publication Data
US 2013/0157387 A1 Jun. 20, 2013

(51) Int. Cl.
*H01J 37/32* (2006.01)
*H01L 21/311* (2006.01)

(52) U.S. Cl.
CPC .... *H01J 37/32963* (2013.01); *H01J 37/3299* (2013.01); *H01L 21/31116* (2013.01)

(58) Field of Classification Search
CPC ......... H01L 21/67253; H01L 21/31116; C23C 14/54; C23C 14/541; H01J 37/32917; H01J 37/32926; H01J 37/3299; H01J 37/3299; H01J 37/32697; H01J 37/32724
USPC ............... 118/665, 677, 679, 688, 715, 728; 156/345.16, 345.25–345.27, 345.53
See application file for complete search history.

(56) References Cited

U.S. PATENT DOCUMENTS 5,958,140 A * 9/1999 Arami et al. ............ 118/725
7,462,335 B2 * 12/2008 Liu et al. ................ 422/186.05
8,002,946 B2 * 8/2011 Lewington et al. ..... 156/345.51
8,440,049 B2 * 5/2013 Zhou et al. .............. 156/345.34
2008/0099435 A1 * 5/2008 Grimbergen ................ 216/60
2008/0102001 A1 * 5/2008 Chandrachood et al. .... 422/129
2009/0001052 A1 * 1/2009 Makino et al. .............. 216/60
2009/0277872 A1 * 11/2009 Yamamoto et al. .......... 216/60

FOREIGN PATENT DOCUMENTS

KR 1020050079745 * 8/2005 ............ G02F 1/13
KR 20070027875 A 3/2007

OTHER PUBLICATIONS

"End Point Detection for Plasma Etching", Trion Technology is represented in Europe by Crystec Technology Trading GmbH, p. 1-4.

* cited by examiner

*Primary Examiner* — Benjamin Kendall
(74) *Attorney, Agent, or Firm* — Eschweiler & Potashnik, LLC (57) ABSTRACT The present disclosure relates to a semiconductor body etching apparatus having a multi-zone end point detection system. In some embodiments, the multi-zone end point detection system has a processing chamber that houses a workpiece that is etched according to an etching process. A plurality of end point detector (EPD) probes are located within the processing chamber. Respective EPD probes are located within different zones in the processing chamber, thereby enabling the detection of end point signals from multiple zones within the processing chamber. The detected end point signals are provided from the plurality of EPD probes to an advanced process control (APC) unit. The APC unit is configured to make a tuning knob adjustment to etching process parameters based upon the detected end point signals and to thereby account for etching non-uniformities.

20 Claims, 6 Drawing Sheets

MULTI-ZONE EPD DETECTORS

BACKGROUND

Modern day integrated chips are formed by executing a complex fabrication process on a semiconductor body. The complex fabrication process often comprises implanting dopants into the semiconductor body and then building one processing layer on top of another to form devices within the semiconductor body and metallization layers above the devices. To selectively form the processing layers in a desired location, the processing layers are often deposited, masked, and then etched in unmasked areas using a dry or plasma etch.

To achieve good etching results an end point detector is located within an etch processing chamber. The end point detector is configured to determine when a processing layer is completely removed from the semiconductor body. This allows for complete removal of one processing layer without damaging an underlying processing layer.

BRIEF DESCRIPTION OF THE DRAWINGS

FIG. 3b illustrates a three dimensional view of some embodiments of the processing chamber shown in FIG. 3a.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor manufactures have constantly increased the size of semiconductor workpieces/wafers to improve processing capabilities and decrease the per unit cost of an integrated chip. As the size of semiconductor wafers increase, the size of processing chambers used for etching a workpiece also increase. The increasing sizes of semiconductor workpieces and processing chambers result in problems for end point detection (EPD) systems having a single site end point detector within a processing chamber. For example, such end point detection systems are unable to detect etching rate non-uniformities in the etching process, especially at wafer sizes of 450 mm. This is because the single site end point detector cannot accurately detect the difference in end points at different locations within the process chamber. Etching non-uniformity causes etching rates to vary over a workpiece and between workpieces, resulting in the wafer loading effect.

Accordingly, the present disclosure relates to a semiconductor body etching apparatus having a multi-zone end point detection system. In some embodiments, the multi-zone end point detection system comprises a processing chamber configured to house a workpiece that is etched according to an etching process. A plurality of end point detector (EPD) probes are comprised within the processing chamber. Respective EPD probes are located within different zones in the processing chamber, thereby enabling the detection of end point signals from multiple zones within the processing chamber. The detected end point signals are provided from the plurality of EPD probes to an advanced process control (APC) unit. The APC unit is configured to make one or more tuning knob adjustments to etching process parameters based upon the detected end point signals and to thereby account for etching non-uniformities.

Figure 1:
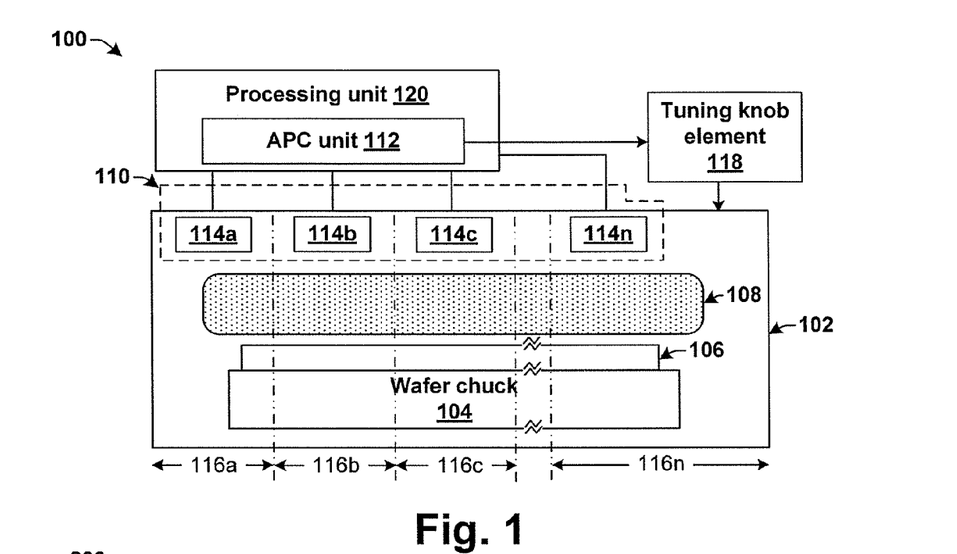
FIG. 1 illustrates a block diagram of some embodiments of a semiconductor body etching apparatus comprising a multi-zone end point detection system linked to an advanced process control unit.

FIG. 1 illustrates a block diagram of some embodiments of a semiconductor body etching apparatus 100 comprising a multi-zone end point detection system 110.

The semiconductor body etching apparatus 100 comprises a processing chamber 102 having a wafer chuck 104 configured to hold a semiconductor workpiece 106 to be etched. The processing chamber 102 is typically held at a low pressure vacuum during etching. In some embodiments, the processing chamber 102 is held at a pressure in the range of about 10 mTorr to about 100 mTorr, for example. During operation, an etching plasma 108 is generated within the processing chamber 102. The etching plasma 108 is configured to etch unmasked areas of the semiconductor workpiece 106.

The multi-zone end point detection system 110 is connected to the processing chamber 102. The end point detection system 110 is configured to generate end point signals, which indicate when a processing layer has been removed from the semiconductor workpiece 106, corresponding to different locations within the processing chamber 102. In various embodiments, the end point detection system 110 may be operated to generate end point signals by measuring the thickness of a processing layer, by measuring optical properties of light reflected from the semiconductor workpiece 106 (e.g., when a processing layer is removed light is reflected from a different material surface causing a change in the surface's optical properties), or by looking at a spectral color of the etching plasma 108 (e.g., different chemical materials emit different wavelengths when brought into a plasma), for example.

The multi-zone end point detection system 110 comprises a plurality of end point detection (EPD) probes 114a-114n located at different locations within the processing chamber 102. Each EPD probe 114a-114n is configured to monitor etching within a corresponding zone 116a-116n of the processing chamber 102 and to generate an end point signal relating to etching within the corresponding zone 116a-116n. In various embodiments, the processing chamber 102 may be broken into any number of spatially distinct zones, with each zone comprising at least one EPD probe 114. The EPD probes 114a-114n are connected to a processing unit 120. The use of multiple EPD probes 114a-114n allows for the processing unit 120 to accurately detect non-uniformities in the etch process based upon differences in the end point signals measured in different zones.

In some embodiments, the processing unit 120 comprises an advanced process control (APC) unit 112. In such embodiments, the semiconductor body etching apparatus 100 has a feedback path in which the APC unit 112 is configured to control process parameters relating to an etching process (etching process parameters) performed within the processing chamber 102. The EPD probes 114a-114n are configured to provide end point signals from different zones 116a-116n to the APC unit 112. The APC unit 112 utilizes end point signals from the different zones 116a-116n to adjust the etching process to account for etching non-uniformities within the processing chamber 102. For example, in some embodiments the APC unit 112 is configured to control operation of a tuning knob element 118. The tuning knob element 118 is configured to adjust one or more etching process parameters used in the etching process based upon detected end point signals in different zones 116a-116n. The one or more etching process parameters may include, but are not limited to etchant gas ratio, wafer chuck temperature, and tuning gas flow.

For example, if the first end point detection probe 114a and the third end point detection probe 114c generate end point signals that indicate different etch rates in the first zone 116a and the third zone 116c, the APC unit 112 may operate the tuning knob element 118 to adjust one or more etching process parameters within the processing chamber 102. The adjustment of the one or more etching process parameters causes the etch rates in the first zone 116a and the third zone 116c to converge to a substantially same etching rate.

Therefore, the semiconductor body etching apparatus 100 allows for end point signals to be generated for multiple zones 116a-116n of a processing chamber 102 and for adjustments to be made to an etching process based upon the generated end point signals.

Figure 2:
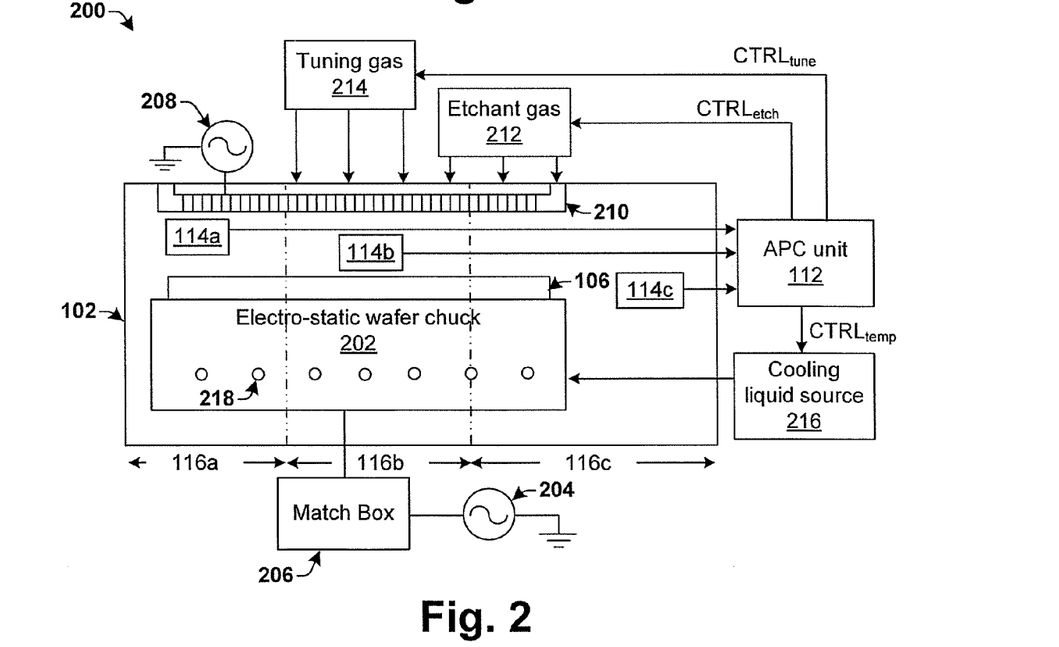
FIG. 2 illustrates a block diagram of some embodiments of a plasma etching system comprising a multi-zone plasma etching system linked to an advanced process control unit.

FIG. 2 illustrates a block diagram of some embodiments of an inductively coupled plasma etching apparatus 200 comprising a multi-zone end point detection system linked to an advanced process control (APC) unit 112. Although FIG. 2 illustrates an inductively coupled plasma etching apparatus, it will be appreciated that the disclosed method and apparatus may be applied to any plasma etching apparatus, such as for example a capacitive coupled plasma etching apparatus, an electron cyclotron resonance plasma etching apparatus, etc.

As illustrated in FIG. 2, the inductively coupled plasma etching apparatus 200 comprises a processing chamber 102 comprising an electrostatic wafer chuck 202. The electrostatic wafer chuck 202 is configured to hold a semiconductor workpiece 106 that is to be etched. In some embodiments, the electrostatic wafer chuck 202 is configured to hold a semiconductor workpiece 106 comprising a 450 mm semiconductor workpiece. An RF bias source 204 is connected to a matchbox 206, which is configured to apply an RF bias to the semiconductor workpiece 106. An RF power source 208 is connected to an antenna coil 210 and is configured to provide an RF signal to the antenna coil 210. The RF signal causes the antenna coil 210 to provide an inductively coupled energy to an etching plasma within the processing chamber 102. In some embodiments, the RF bias is in a range of about 100 V to about 500 V, while the RF power is in a range of about 100 W to about 2500 W.

The processing chamber 102 is divided into three zones 116a-116c. Each zone 116a-116c comprises an EPD probe 114a-114c. In some embodiments, the EPD probes 114a-114c comprise optical emission spectroscopy elements having an optical spectrometer configured to monitor the emission spectrum of an etching plasma within the processing chamber 102. When a processing layer, such as for example an oxide or metal layer, has been etched away the composition and emission spectrum of the etching plasma changes.

An etchant gas source 212 is in communication with the processing chamber 102 by way of a plurality of etchant gas conduits configured to provide one or more etchant gases to the processing chamber 102. In some embodiments, a first etchant gas conduit is configured to provide etchant gases to the first zone 116a, a second etchant gas conduit is configured to provide etchant gases to the second zone 116b, and a third etchant gas conduit is configured to provide etchant gases to the third zone 116c. The etchant gases provided to the processing chamber 102 may vary depending on the material to be etched. In some embodiments, wherein the material to be etched comprises an oxide material, the etchant gases may comprise a mixture of $C_2$ and/or $F_6$, for example.

A tuning gas source 214 is also in communication with the processing chamber 102 by way of a plurality of tuning gas conduits configured to provide one or more tuning gases to the processing chamber 102. In some embodiments, a first tuning gas conduit is configured to provide a tuning gas to the first zone 116a, a second tuning gas conduit is configured to provide a tuning gas to the second zone 116b, and a third tuning gas conduit is configured to provide a tuning gas to the third zone 116c. The tuning gas is configured to provide for tuning of the etching process etching rate. In some embodiments, the tuning gas may comprise $O_2$, for example.

A cooling liquid source 216 is configured to provide a cooling liquid to the electrostatic wafer chuck 202. The cooling liquid is circulated through channels 218 in the electrostatic wafer chuck 202 to regulate the temperature of the electrostatic wafer chuck 202 in different zones 116a-116c. Since the electrostatic wafer chuck 202 is in contact with the semiconductor workpiece 106, the temperature of the electrostatic wafer chuck 202 affects the temperature of the semiconductor workpiece 106 and therefore the rate of etching in the different zones 116a-116c. In some embodiments, the cooling liquid may comprise water, for example.

The APC unit 112 is configured to receive end point signals from EPD probes 114a-114c located within different zones 116a-116c. The APC unit 112 utilizes the received end point signals to adjust etching process parameters to account for the etching non-uniformities between the zones. For example, in some embodiments, the APC unit 112 is configured to adjust the flow rate of a tuning gas provided from the tuning gas source 214 to one or more zones of the processing chamber 102. In some embodiments, the APC unit 112 is configured to adjust the etchant gas ratio of etchant gases provided from the etchant gas source 212 to one or more zones within the processing chamber 102. In some embodiments, the APC unit 112 is configured to adjust the temperature of cooling liquid provided to the electrostatic wafer chuck 202 in one or more zones. It will be appreciated that the APC unit 112 may be configured to adjust one or more than one of the tuning gas flow rate, the etchant gas ratio, and/or the temperature of cooling liquid to mitigate etching non-uniformities within different zones of the processing chamber 102.

Figure 3A:
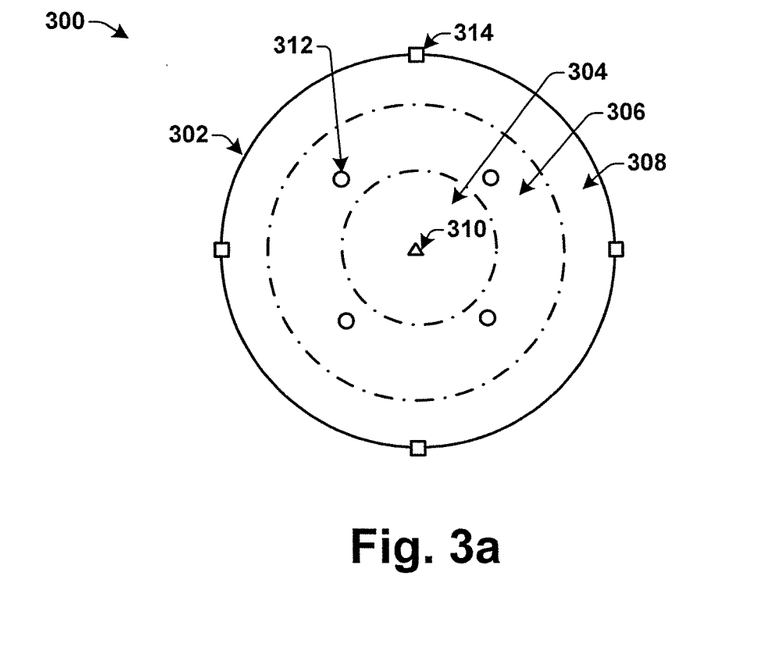
FIG. 3a illustrates a top view of some embodiments of a processing chamber showing exemplary locations of end point detection probes for a three zone end point detection system.
Figure 3B:
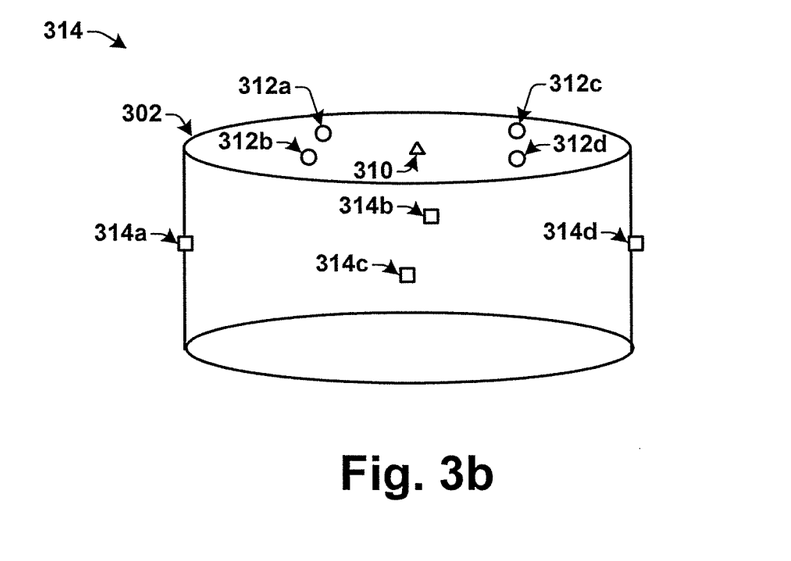

FIGS. 3a-3b illustrates different views of some embodiments of a processing chamber 302 showing exemplary locations of end point detection (EPD) probes for a multi-zone end point detection system.

FIG. 3a illustrates a top view 300 of some embodiments of the processing chamber 302. The processing chamber 302 is divided into three zones: a center zone 304, a middle zone 306, and a wafer edge zone 308. Each zone comprises one or more EPD probes configured to monitor etching of a processing layer within the zone. For example, the center zone 304 comprises a single EPD probe 310 (illustrated as a triangle) located at the center of the processing chamber 302 and configured to monitor etching in the center zone 304. The middle zone 306 comprises a plurality of EPD probes 312 (illustrated as circles) located at symmetric positions within the middle zone 306 and configured to monitor etching in the middle zone 306. The wafer edge zone 308 also comprises a plurality of EPD probes 314 (illustrated as squares) located at symmetric positions within the wafer edge zone 308 and configured to monitor etching in the wafer edge zone 308.

FIG. 3b illustrates a three dimensional view 314 of some embodiments of the processing chamber 302. As shown in the three dimensional view 314 of the processing chamber 302, a EPD probe 310 is mounted on the top of the processing chamber 302 in the middle of the center zone (zone 304 in FIG. 3a). A plurality of EPD probes 312a-312d are mounted on top of the processing chamber 302 in the middle zone (zone 306 in FIG. 3a). A plurality of EPD probes 314a-314d are mounted on the sidewall of processing chamber 302 in the wafer edge zone 308 (zone 308 in FIG. 3a).

Figure 4:
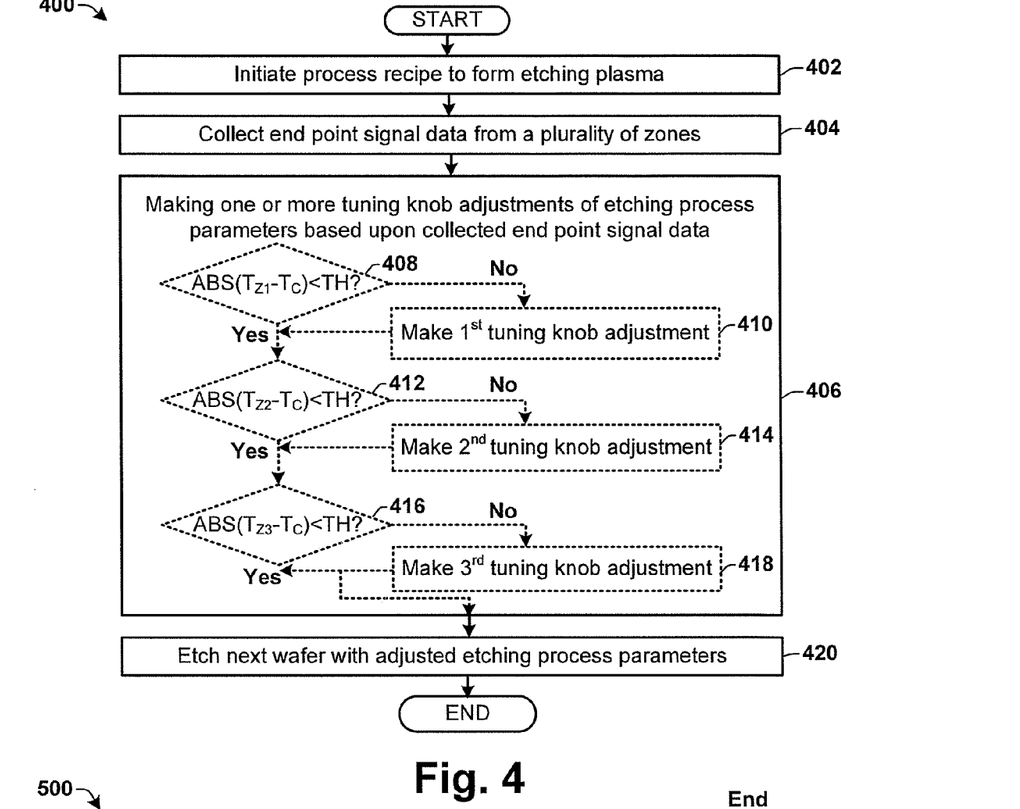
FIG. 4 illustrates a flow diagram of some embodiments of a method for adjusting etching process parameters to improve etching uniformity.

FIG. 4 illustrates a flow diagram of some embodiments of a method 400 for detecting etching non-uniformities and adjusting etching process parameters within a processing chamber to improve etching uniformity. While the methods provided herein (e.g., method 400, 600, 900, and 1000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 402 a process recipe is initiated to form an etching plasma within a processing chamber. The processing recipe may comprise etching process parameters including a pressure and temperature of the processing chamber, etchant gases composition and ratio, tuning gases and flows, wafer chuck temperature, etc.

Figure 5:
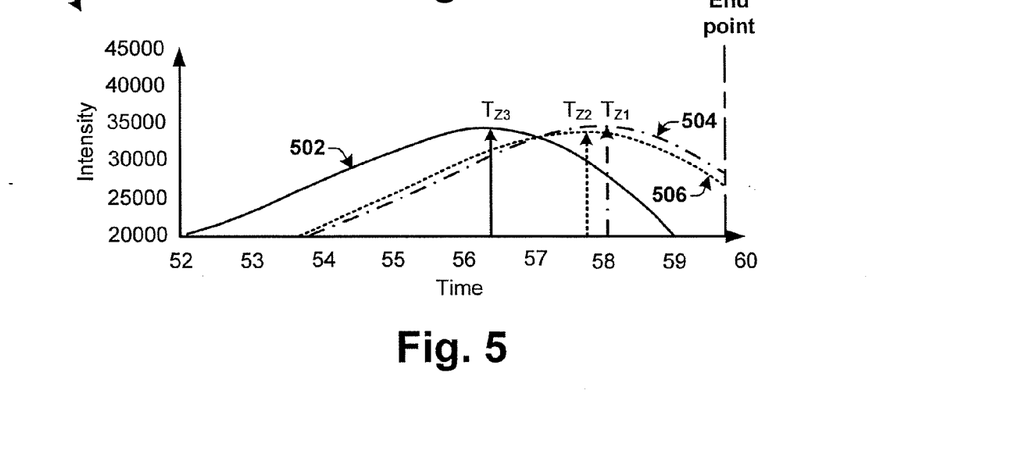
FIG. 5 illustrates an exemplary graph showing the spectral intensity of an end point detection system having a single end point detection probe comprising an optical emission spectrometer.

At step 404 end point signal data is collected for a plurality of different zones within the processing chamber. FIG. 5 shows an exemplary graph 500 showing the spectral intensity of an end point detection system having three EPD probes comprising optical emission spectrometers. The spectral intensity of plasma emission detected by an EPD probe is shown on the y-axis and time is shown on the x-axis. End point signal data taken by one or more EPD probes located within a first zone is illustrated by trend line 502, which has a spectral intensity peak at time $T_{Z1}$. End point signal data taken by one or more EPD probes located within a second zone is illustrated by trend line 504, which has a peak at time $T_{Z2}$. End point signal data taken by one or more EPD probes located within a third zone is illustrated by trend line 506, which has a peak at time $T_{Z3}$. The different times of the different end point signal data peaks indicates a difference in etch rate between the different zones of the processing chamber.

At step 406 one or more tuning knob etching process parameters are adjusted based upon end point signals from different zones. For example, as shown in graph 500, since trend line 502 has a peak at an earlier time ($T_{Z3}$) than trend lines 504 and 506 ($T_{Z1}$ and $T_{Z2}$, respectively), the etching rate in the third zone is greater than the etching rate in the first and second zones. To account for the non-uniformity in the etching rate, one or more etching process parameters are adjusted to slow the etching process in the third zone and/or to speed up the etching process in the first and second zones so that the etching process is uniform through the three zones.

In some embodiments, the one or more process parameters are adjusted based upon a comparison of the collected end point signal data with a predetermined value $T_C$. If end point signal data collected from a zone diverges from the predetermined value $T_C$ by an amount that is above a threshold TH, the etching process within the zone can be adjusted. By comparing the collected end point signal data to the predetermined value $T_C$, uniformity between the etching process within the different zones can be improved. In some embodiments, the predetermined value $T_C$ can be set by a user (e.g., based on experimental observations, etch recipes, etc.). In some embodiments, the predetermined value $T_C$ may be calculated based upon end point signals received from one or more of the different zones.

Steps 408-418 set forth an exemplary process by which end point signal data is compared to a predetermined value $T_C$. It will be appreciated that the exemplary process set forth in steps 408-418 is one example of a process for adjusting process parameters and is not intended to limit the scope of the disclosure.

At step 408 a time difference between the peak of end point signals from a first zone and the predetermined value is determined. The time difference is determined by calculating the absolute value of the difference between the peak of end point signals measured in the first zone $T_{Z1}$ and the predetermined value $T_C$. If the absolute value is less than a threshold TH (i.e., ABS($T_{Z1}-T_C$)<TH) then no adjustment is made to the etching process parameters. However, if the absolute value greater than or equal to the threshold TH (i.e., ABS($T_{Z1}-T_C$)≥TH) then a first tuning knob adjustment to etching process parameters (e.g., etchant gas ratio, tuning gas flow, wafer chuck temperature, etc.) is made at step 410 to bring the etching rate within the first zone within the threshold TH.

At step 412 a time difference between the peak of end point signals from a second zone and the predetermined value is determined. The time difference is determined by calculating the absolute value of the different between the peak of end point signals measured in the second zone and the predetermined value $T_C$. If the absolute value is less than a threshold TH, then no adjustment is made to the etching process parameters. However, if the absolute value is greater than or equal to the threshold TH, then a second tuning knob adjustment is made to etching process parameters at step 414 to bring the etching rate within the second zone within the threshold TH.

At step 416 a time difference between the peak of end point signals from a third zone and the predetermined value is determined. The time difference is determined by calculating the absolute value of the different between the peak of end point signals measured in the third zone and the predetermined value $T_C$. If the absolute value is less than a predetermined constant C, then no adjustment is made to the etching process parameters. However, if the absolute value is greater than or equal to the threshold TH, then a third tuning knob adjustment is made to etching process parameters at step 418 to bring the etching rate within the third zone within the threshold TH.

At step 420 a next wafer is provided into the etching system. The next wafer is subjected to the new etching process using parameters adjusted at step 406.

Therefore, the method 400 allows for process parameters to be adjusted based upon difference in the end point signals detected within different zones of a processing chamber.

Figure 6:
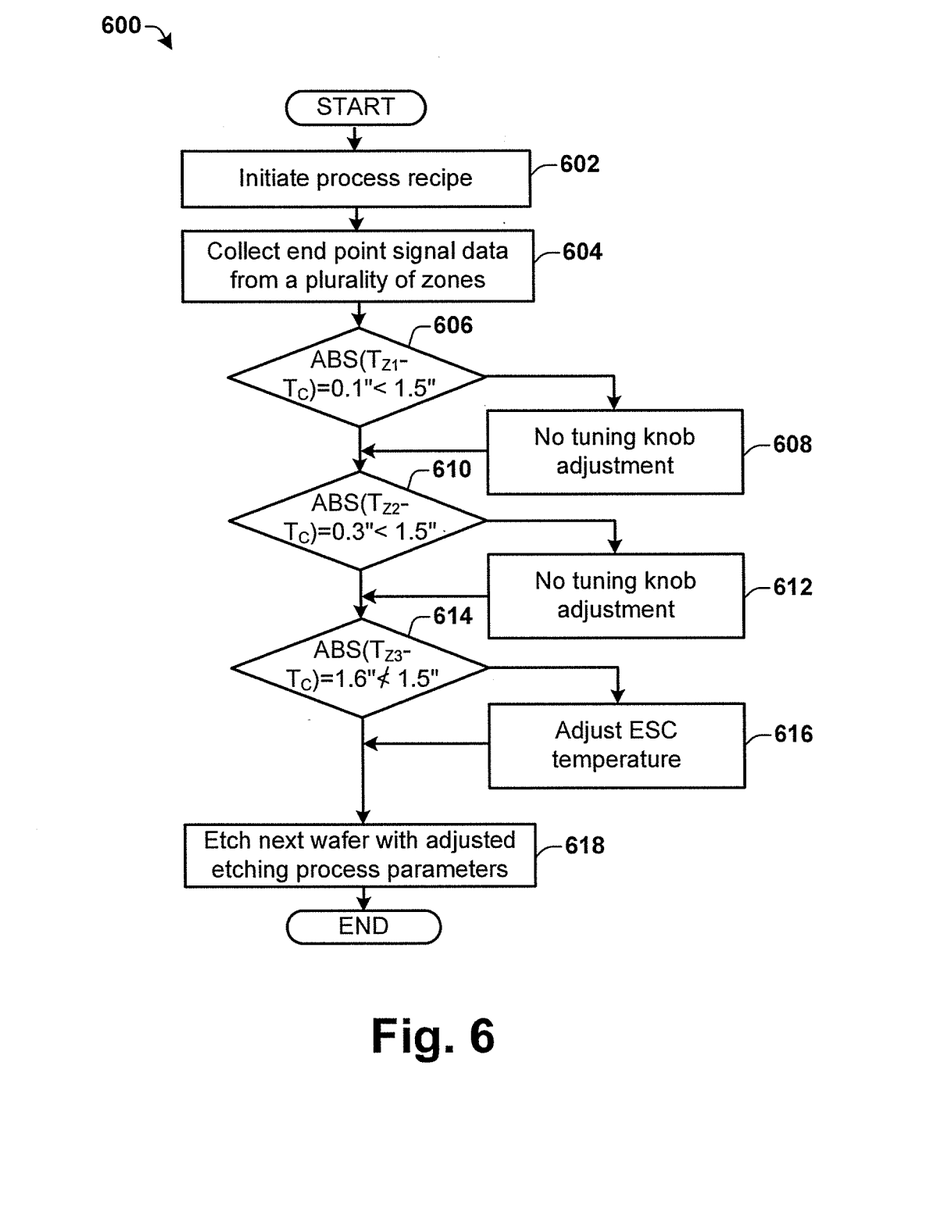
FIG. 6 illustrates a flow diagram of some embodiments of a method for adjusting the temperature of an electrostatic chuck based upon collected end point detection data.
Figure 7:
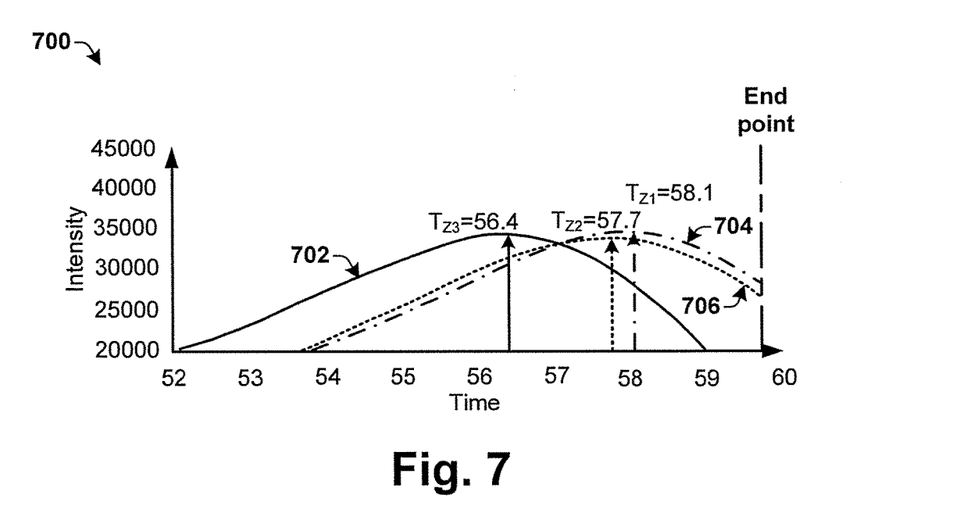
FIG. 7 illustrates an exemplary graph showing spectral intensities measured by a multi-zone end point detection system prior to adjustments being made by an advanced process control unit.
Figure 8:
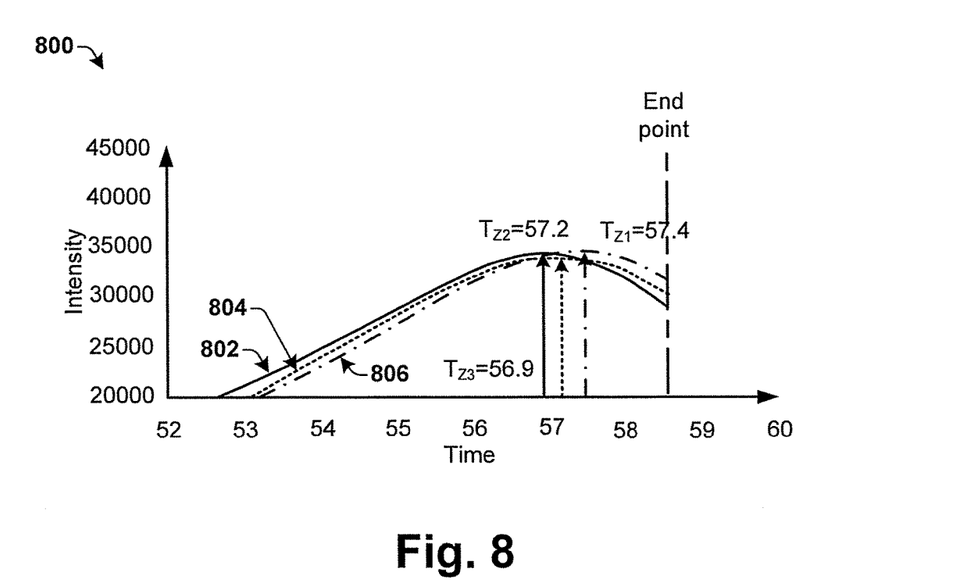
FIG. 8 illustrates an exemplary graph showing spectral intensities measured by a multi-zone end point detection system after adjustments are made by an advanced process control unit.

FIGS. 6-8 illustrate an application of method 400 to a specific etching process, wherein an adjustment is made to a process parameters comprising wafer chuck temperature. It will be appreciated that the processing parameters and adjustments made to the processing parameters are only examples and that the application shown in FIGS. 6-8 is a non-limiting application that is intended to aid the reader in understanding of the disclosed method.

FIG. 6 illustrates a flow diagram of some embodiments of a method 600 for adjusting a process parameter comprising a temperature of an electrostatic wafer chuck based upon data collected from a plurality of EPD probes within a processing chamber. In method 600, a predetermined value $T_C$ of 58 sec and a threshold TH of 1.5 sec are used.

At step 602 a process recipe is initiated to form an etching plasma within a processing chamber. In some embodiment the process recipe is configured to form an etching plasma that etches a processing layer comprising an oxide layer. The process is performed within a processing chamber having three zones: a center zone, a middle zone, and an edge wafer zone. The processing chamber is held at a mean pressure of about 40 mTorr. The process is executed with an RF power of approximately 2000 W and a RF bias of approximately 400 W applied to the wafer. The etchant gas chemistry comprises a mixture of carbon fluoride ($C_xF_x$), Argon (Ar), and oxygen ($O_x$) is provided to the processing chamber at a flow ratio of approximately 70/600/40. The etching chemistry is distributed at a gas ratio of 30:70 between the center and at the edge of the process chamber (i.e., 30% of the etchant gas flow rate is in the center zone and 70% of the etchant gas flow rate is at the edge zone). An edge tuning gas of $O_2$ is provided at an edge zone at a rate of fluoride 1.5 standard cubic centimeters per minute (SCCM). The electrostatic chuck is held at a temperature of 25° C. in each zone.

At step 604 end point signal data is collected from a plurality of different zones within the processing chamber. FIG. 7 shows a graph 700 showing the spectral intensity of an end point detection system having three EPD probes comprising optical emission spectrometers. Data taken by one or more EPD probes located within a first zone is illustrated by trend line 702, which has a peak at time $T_{Z1}=58.1$ sec. Data taken by one or more EPD probes located within a second zone is illustrated by trend line 704, which has a peak at time $T_{Z2}=57.7$ sec. Data taken by one or more EPD probes located within a third zone is illustrated by trend line 706, which has a peak at time $T_{Z3}=56.4$ sec.

At step 606 a time difference between the peak of end point signals from a first zone and a predetermined value is determined by calculating the absolute value of the difference between peak $T_{Z1}$ and $T_C$. Since the peak of the end point signal detected in the first zone is at a time $T_{Z1}=58.1$ and $T_C=58$ sec, the absolute value of the difference is 0.1 sec, which is less than a threshold TH=1.5 sec (i.e., ABS$(T_{Z1}-T_C)=0.4"<1.5"$) and no tuning knob adjustment is made at step 608.

At step 610 a time difference between the peak of end point signals from a second zone and a predetermined value is determined by calculating the absolute value of the difference between peak $T_{Z2}$ and $T_C$. Since the peak of the end point signal detected in the second zone is at a time $T_{Z1}=57.7$ and $T_C=58$ sec, the absolute value of the difference is 0.3 sec, which is less than a threshold TH=1.5 sec (i.e., ABS$(T_{Z2}-T_C)=0.3"<1.5"$) and no tuning knob adjustment is made at step 612.

At step 614 a time difference between the peak of end point signals from a third zone and a predetermined value is determined by calculating the absolute value of the different between peak $T_{Z1}$ and $T_C$. Since the peak of the end point signal detected in the third zone is at a time $T_{Z3}=56.4$ sec and $T_C=58.0$ sec, the absolute value of the difference is greater than a threshold TH=1.5 sec (i.e., ABS$(T_{Z3}-T_C)=1.6">1.5"$) and an adjustment is made to the temperature of the wafer chuck at step 616.

Since the peak of the end point signal in the third zone is at an earlier time than the predetermined constant $T_C$, an adjustment is made to reduce the temperature of the cooling water provided to the third zone from 25° C. to 24.5° C. This reduction in temperature slows the etching rate in the third zone. In some embodiments, additional etching process parameters may also be adjusted. For example, the temperature of the cooling water provided to the first zone can also be increased from 25° C. to 25.5° C. to increases the etching rate in the first zone. By also increasing the etching rate in the first zone, the etching rates between the first and third zones converge.

At step 618 a next wafer is etched. The next wafer is etched according to the adjusted process parameters, wherein the temperature of the wafer chuck is 24.5° C. in the first zone, 25° C. in the second zone, and 25.5° C. in the third zone.

FIG. 8 illustrates a graph 800 showing the spectral intensity of a second wafer etched in a process chamber (at step 618) having an end point detection system with a plurality of EPD probes comprising an optical emission spectrometers. The resulting spectral data shows a convergence of peak times between the different zones, indicating that the non-uniformities in the etching rate have been reduced. For example, data taken by one or more EPD probes located within a first zone is illustrated by trend line 802, which has a peak at time $T_{Z1}=57.4$ sec. Data taken by one or more EPD probes located within a second zone is illustrated by trend line 804, which has a peak at time $T_{Z2}=57.2$ sec. Data taken by one or more EPD probes located within a third zone is illustrated by trend line 806, which has a peak at time $T_{Z3}=56.9$ sec.

Figure 9:
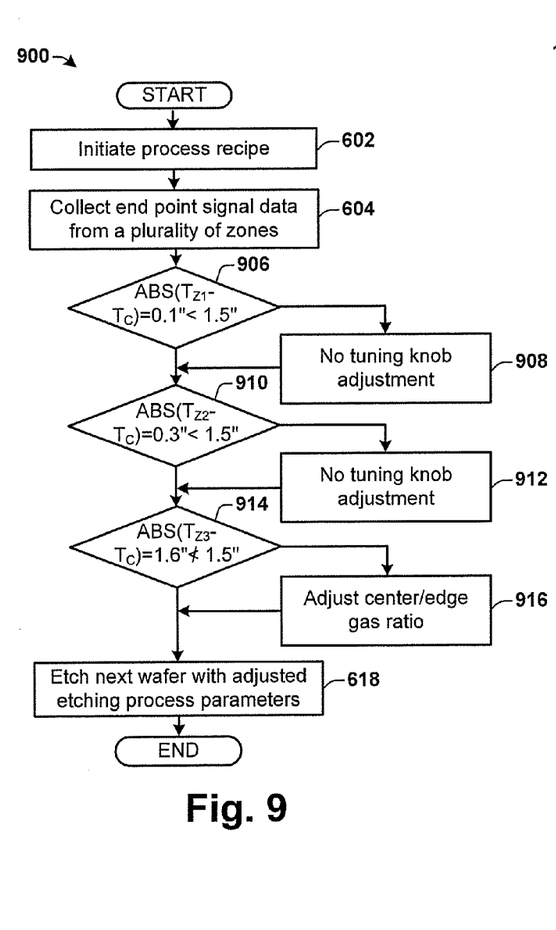
FIG. 9 illustrates a flow diagram of some embodiments of a method for adjusting an etchant gas ratio based upon collected end point signal data.

FIG. 9 illustrates a flow diagram of some alternative embodiments of a method 900 for adjusting a process parameter comprising an etchant gas ratio based upon collected EPD data.

The process recipe initiated at step 602 results in end point signal data having peaks that do not violate the threshold at steps 906 and 910. However, at step 914 the absolute value of the difference between the peak of end point signals detected in a third zone $T_{Z3}=56.6$ and the predetermined constant $T_C=58$ sec is greater than a predetermined constant C32 1.5 sec. Therefore, an adjustment is made at step 916 to the etchant gas ratio.

Since the peak of the end point signal in the third zone is at an earlier time than the predetermined constant $T_C$, an adjustment is made to increase the center to edge gas ratio from 30:70 to 40:60. The adjustment to the gas ratio changes the ratio of the gas flow rate at the center and at the edge of the process chamber so that an increased amount of etchant gas is provided to the center and a decreased amount of etchant gas is provided to the edge. For example, the 40:60 gas ratio provides for 40% of the 70 $C_xF_x$/600 Ar/40 $O_2$ gas flow rate would be in the center and 60% of the gas flow rate would be at the edge. By increasing the center gas ratio and decreasing the edge gas ratio, the etching time in the third zone is decreased, while the etching time in the first zone is increased. Therefore, the adjustment causes the etching rates in different zones to converge.

At step 918 a next wafer is etched. The next wafer is etched according to the adjusted process parameters, wherein etchant gas flow ratio is 40:60.

Figure 10:
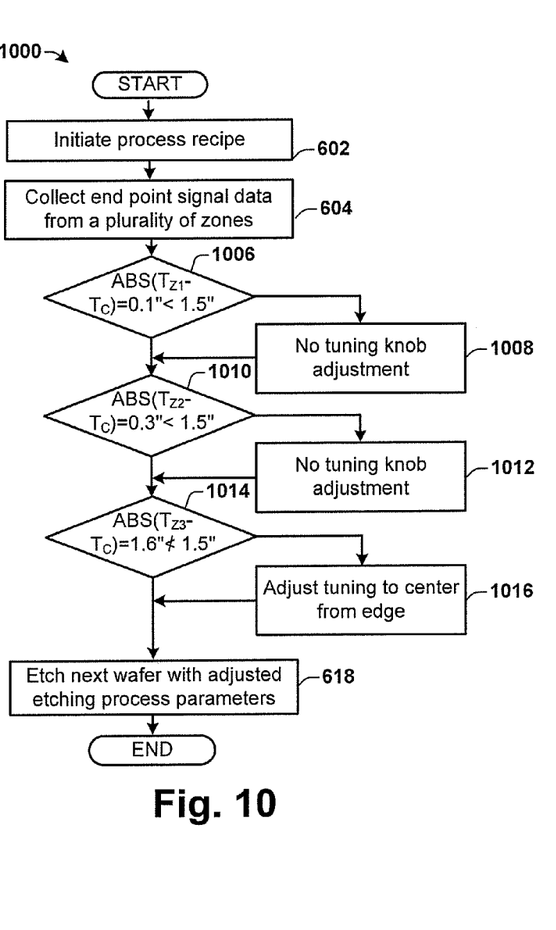
FIG. 10 illustrates a flow diagram of some embodiments of a method for adjusting a tuning gas flow based upon collected end point signal data.

FIG. 10 illustrates a flow diagram of some embodiments of a method 1000 for adjusting a process parameter comprising a tuning gas flow rate based upon collected EPD data.

The process recipe initiated at step 602 results in end point signal data having peaks that do not violate the predetermined constant at steps 1006 and 1010. However, at step 1014 the absolute value of the difference between the peak of end point signals detected in a third zone $T_{Z3}=56.6$ and the predetermined constant $T_C=58$ sec is greater than a predetermined constant C=1.5 sec. Therefore, an adjustment is made at step 1016 to tuning gas flow.

Since the peak of the end point signal in the third zone is at an earlier time than the predetermined constant $T_C$, the adjustment is made to change injection of the tuning gas from the wafer edge zone to the center zone. By moving the tuning gas from a flow of 1.5 SCCM at the wafer edge zone and 0 SCCM at the center zone to a flow of 0 SCCM at the wafer edge zone and 1.5 SCCM at the center zone, the etching time in the third zone is decreased, while the etching time in the first zone is increased. Therefore, the adjustment causes the etching rates in different zones to converge.

At step 1018 a next wafer is etched. The next wafer is etched according to the adjusted process parameters, wherein the tuning gas has a flow of 0 SCCM at the wafer edge zone and a flow of 1.5 SCCM at the center zone.

It will be appreciated that the methods 600, 900, and 1000 may be performed separately or may be performed in conjunction with one another. For example, in some embodiments an APC unit may be configured to perform method 600, then method 900, then method 1000 so as to reduce non-uniformities in an etching process.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning-like "comprising". Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the present disclosure relates to an etching system having a multi-zone end point detection system linked advance process control system for the controlling of tuning knob processing parameters.

In some embodiments, the present disclosure relates to a semiconductor body etching apparatus. The apparatus comprises a processing chamber configured to house a semiconductor workpiece having a processing layer that is to be etched according to an etching process. A multi-zone end point detection system is configured to detect end point signals, which indicate when the processing layer is removed, at different locations within the processing chamber. An advanced process control unit is connected to the multi-zone end point detection system and configured to make a tuning knob adjustment of etching process parameters based upon the end point signals detected at different locations within the processing chamber.

In another embodiment, the present disclosure relates to an end point detection (EPD) system. The EPD system comprises a processing chamber comprising a plurality of zones spatially distinct from one another. The EPD system further comprises a plurality of end point detection probes, wherein one or more of the plurality of end point detection probes are located within each of the plurality of zones and are configured generate an end point signal corresponding to an etching rate within the zone, so that non-uniformities in the etching process can be detected at different zones based upon difference in the end point signals.

In another embodiment, the present disclosure relates to a method for improving etching uniformity. The method comprises initiating an etching process recipe to form an etching plasma within a processing chamber. End point signal data is collected from a plurality of different zones within the processing chamber. The end point signals collected from different zones are compared and one or more tuning knob process parameters adjustments are made based upon the difference in end point signals.

What is claimed is:
1. A semiconductor body etching apparatus, comprising:
   a processing chamber configured to house a semiconductor workpiece having a processing layer that is to be etched according to an etching process;
   a multi-zone end point detection system configured to detect end point signals, which indicate when the processing layer is removed, at a plurality of different zones within the processing chamber; and
   an advanced process control unit connected to the multi-zone end point detection system and configured to determine times at which spectral intensity peaks occur for spectral data received from the plurality of zones and to make one or more tuning knob adjustments of etching process parameters when one or more of the times vary from a threshold value by more than a constant time value.

2. The apparatus of claim 1, wherein the multi-zone end point detection system comprises a plurality of end point detection probes located within the processing chamber.

3. The apparatus of claim 2, wherein the plurality of end point detection probes comprise optical spectrometers configured to monitor an emission spectrum of an etching plasma within the processing chamber.

4. The apparatus of claim 3, wherein the advanced process control unit is configured to:
calculate an absolute value of a time difference between a spectral intensity peak of end point signals detected in one of the plurality of zones and the threshold value;
compare the absolute value of the time difference with the constant time value; and
make the tuning knob adjustment of etching process parameters if the absolute value of the time difference is greater than or equal to the constant time value.

5. The apparatus of claim 2,
wherein each zone comprises one or more of the plurality of end point detection probes, which are configured to monitor etching within the zone.

6. The apparatus of claim 5, wherein the plurality of different zones, comprise:
a center zone located within a center of the processing chamber;
a wafer edge zone located along a perimeter of the processing chamber; and
a middle zone located radially between the center zone and the wafer edge zone.

7. The apparatus of claim 6, further comprising:
an etchant gas source connected to the processing chamber by way of one or more first etchant gas conduits that enter the processing chamber at the center zone, one or more second etchant gas conduits that enter the processing chamber at the wafer edge zone, and one or more third etchant gas conduits that enter the processing chamber at the middle zone;
wherein the advanced process control unit is configured to control a ratio between etchant gases that are provided from the etchant gas source to the center zone, the wafer edge zone, and the middle zone based upon the end point signals detected at different locations within the processing chamber.

8. The apparatus of claim 5, further comprising:
a tuning gas source connected to the processing chamber by way of a plurality of tuning gas conduits that enter the processing chamber at separate locations;
wherein the advanced process control unit is configured to control a flow of a tuning gas from the tuning gas source to each of the plurality of zones based upon the end point signals detected at different locations within the processing chamber.

9. The apparatus of claim 5, further comprising:
an electrostatic wafer chuck comprising a plurality of channels configured to circulate a cooling liquid within the electrostatic wafer chuck to regulate a temperature of the electrostatic wafer chuck;
wherein the advanced process control unit is configured to control a temperature of the cooling liquid within each of the plurality of zones based upon the end point signals detected at different locations within the processing chamber.

10. An end point detection (EPD) system, comprising:
a processing chamber comprising a plurality of zones spatially distinct from one another;
a plurality of end point detection probes, wherein one or more of the plurality of end point detection probes are located within each of the plurality of zones and are configured generate an end point signal corresponding to an etching process within a corresponding zone; and
an advanced process control (APC) unit connected to the plurality of end point detection probes and configured to detect times at which a spectral intensity peak occurs for spectral data received from the plurality of zones and to selectively control a ratio between etchant gases that are provided from an etchant gas source to different ones of the plurality of zones based on a time at which a spectral intensity peak occurs in end point signals from the plurality of zones.

11. The EPD system of claim 10, wherein the plurality of zones comprise:
a center zone located within a center of the processing chamber;
a wafer edge zone located along a perimeter of the processing chamber; and
a middle zone located radially between the center zone and the wafer edge zone.

12. The EPD system of claim 10, wherein the advanced process control (APC) unit is configured to make a tuning knob adjustment to one or more etching process parameters based upon non-uniformities in the etching process between the plurality of zones.

13. The EPD system of claim 10, wherein the plurality of end point detection probes comprise:
a first EPD probe mounted on a top of the processing chamber in a center zone located within a center of the processing chamber;
a second EPD probe mounted on a sidewall of the processing chamber in a wafer edge zone located along a perimeter of the processing chamber; and
a third EPD probe mounted on the top of the processing chamber in a middle zone located radially between the center zone and the wafer edge zone.

14. An end point detection (EPD) system, comprising:
a processing chamber comprising a plurality of zones spatially distinct from one another;
a plurality of end point detection probes disposed onto sidewalls and a ceiling of the process chamber, wherein one or more of the plurality of end point detection probes are located within each of the plurality of zones and are configured generate an end point signal corresponding to an etching process within the zone, so that non-uniformities in an etching process can be detected within different zones based upon a difference in end point signals received from end point detection probes in the different zones; and
an advanced process control unit connected to the plurality of end point detection probes and configured to calculate an absolute value of a time difference between a spectral intensity peak of end point signals detected in one of the plurality of zones and a predetermined value, to compare the absolute value of the time difference with a constant time value, and to make a tuning knob adjustment of etching process parameters when the absolute value of the time difference is greater than or equal to the constant time value.

15. The EPD system of claim 14, wherein the advanced process control (APC) unit is further configured to selectively perform separate tuning knob adjustments, which are respectively based on a time at which a spectral intensity peak occurs in end point signals from each one of the different zones.

16. The EPD system of claim 14, wherein the plurality of zones comprise:

a center zone located within a center of the processing chamber;

a wafer edge zone located along a perimeter of the processing chamber; and a middle zone located radially between the center zone and the wafer edge zone.

17. The EPD system of claim 14, wherein the plurality of end point detection probes comprise:

a first EPD probe mounted on a top of the processing chamber in a center zone located within a center of the processing chamber;

a second EPD probe mounted on a sidewall of the processing chamber in a wafer edge zone located along a perimeter of the processing chamber; and a third EPD probe mounted on the top of the processing chamber in a middle zone located radially between the center zone and the wafer edge zone.

18. The EPD system of claim 1, wherein the advanced process control unit is further configured to selectively perform separate tuning knob adjustments, which are respectively based on a time at which a spectral intensity peak occurs in one of the plurality of zones.

19. The EPD system of claim 18, wherein the advanced process control unit is configured to make a first tuning knob adjustment if an absolute value of a first time difference between a first time at which a first spectral intensity peak occurs in a first one of the plurality of zones and a predetermined time value is greater than a first predetermined constant; and wherein the advanced process control unit is configured to make a second tuning knob adjustment if an absolute value of a second time difference between a second time at which a second spectral intensity peak occurs in a second one of the plurality of zones and the predetermined time value is greater than a second predetermined constant.

20. The EPD system of claim 18, wherein the threshold value is calculated based upon end point signals received from one or more different ones of the plurality of zones.

* * * * *